United States Patent [19]
Kawakami et al.

[11] Patent Number: 5,268,194
[45] Date of Patent: * Dec. 7, 1993

[54] METHOD OF PACKING FILLER INTO THROUGH-HOLES IN A PRINTED CIRCUIT BOARD

[75] Inventors: Shin Kawakami; Satoshi Haruyama; Hirotaka Okonogi, all of Saitama, Japan

[73] Assignee: Nippon CMK Corp., Japan

[*] Notice: The portion of the term of this patent subsequent to Jul. 28, 2009 has been disclaimed.

[21] Appl. No.: 734,255

[22] Filed: Jul. 22, 1991

[30] Foreign Application Priority Data

Aug. 10, 1990 [JP] Japan ................... 213149

[51] Int. Cl.[5] ............................. C23C 26/00
[52] U.S. Cl. .......................... 427/97; 427/96
[58] Field of Search ....................... 427/96, 97

[56] References Cited
U.S. PATENT DOCUMENTS

| | | | |
|---|---|---|---|
| 4,145,691 | 9/1992 | Kawakami | 118/300 |
| 4,323,593 | 4/1982 | Tsunashima | 427/97 |
| 4,324,815 | 4/1982 | Mitani | 427/96 |
| 4,664,945 | 5/1987 | Maeda | 427/96 |
| 4,938,994 | 7/1990 | Choinski | 427/96 |
| 5,133,120 | 7/1992 | Kawakami | 427/97 |

Primary Examiner—Shrive Beck
Assistant Examiner—Vi Duong Dang
Attorney, Agent, or Firm—Bruce L. Adams; Van C. Wilks

[57] ABSTRACT

A method of packing filler into through-holes in a printed circuit board is disclosed. The method comprises steps of packing the filler through a mask into the through-holes and at the same time smoothing protrusions of the filler at the upper and lower openings of the through-holes by means of squeegees. In this method, the mask may be a silk screen provided with open-worked packing holes for packing the filler in the positions corresponding to those in which the through-holes of said printed circuit board are packed. In the above method, the filler may be packed by delivering pressurized filler from a packing nozzle, which comprises 1) a packing means connected both to a manipulation means for actuating a delivery valve for delivering the filler from said nozzle tip and to a supply means for supplying the filler and 2) a nozzle tip attached to the delivery end of said packing nozzle. In the above-described method, said filler may be a solvent-less filler.

13 Claims, 3 Drawing Sheets

METHOD OF PACKING FILLER INTO THROUGH-HOLES IN A PRINTED CIRCUIT BOARD

BACKGROUND OF THE INVENTION

The present invention relates to a method of packing filler into the through-holes in a printed circuit board.

There are two conventional methods of packing filler composed of a conductive material into through-holes in a printed circuit board. In one method the conductive material is attached to a packing pin, and then is transferred to the inner wall of a through-hole from the outer peripheral surface of said packing pin by inserting said pin into a through-hole that has been bored in the printed circuit board. In the other method, the conductive material is packed into each through-hole on the printed circuit board through a printing silk screen that has open-work corresponding to the circuit design of the printed circuit board.

The former described packing method, which uses said pin system, requires a plurality of repeated operations to attach conductive material to the packing pins and then to insert those pins into their respective through-holes on the printed board in order to embed the material inside the through-holes. This method is inefficient and its operations are decidedly complicated because it is difficult to attach enough conductive material to each pin.

Moreover, in such operations, the conductive material must be heated for curing each time it is transferred to the inner wall of a through-hole from a packing pin. This inflicts much thermal damage on the printed circuit board's structural material and significantly deteriorates the board's dimensional stability.

In addition, when a printed circuit board has many through-holes bored, many pins must be used at once. Since pin-arranging design limitations make it usually impossible to use more than 1,000 pins, the area of a printed circuit board is limited in many cases to 300 mm².

It is also difficult to mass produce, install, and operate so many pin jigs whose pins must be arranged to correspond to the through-holes of a printed circuit board.

When the latter described silk-screen method is used, the squeegee's pressure against the screen is not uniform. In addition, under the usual squeegee pressure, it is difficult to pack conductive material into each through-hole on the printed circuit board, and impossible to do so if the printed circuit board is thick or the diameter of the through-hole is small. In the present technical standard for packing conductive material, 0.7 mm is the minimum diameter of a through-hole when the board thickness is 1.6 mm.

In the two above-described conventional methods the poor fluidity of the conductive material has a large effect on the uniformity of packed material and tends to complicated operations. The usual countermeasure is to add solvent to the conductive material to make its fluidity more uniform. This remedial measure, however, causes gas bubbles to accumulate and cracks to develop in the through-holes as a result of heat generation and consequent solvent evaporation during the hardening of conductive material after being packed. This results in the possible failure of conductivity and difficulty in removing the solvent.

Thus, a higher-alcohol-based solvent with a high boiling point, and thereby a resistance to vaporization, is often used to retain desirable fluidity for a long duration. But this causes another difficulty. Namely, that the complete removal of such a solvent without generation of bubbles requires the vaporization of the solvent over a long period of time and at a sufficiently low temperature to prevent unremoved solvent from decreasing the reliability of the printed circuit board.

Another problem is that if filler packed in a through-hole protrudes and is hardened on the upper or lower surface of the substrate, the protrusion will have a harmful effect on subsequent treatment processes. For instance, press work using a die in the machining process during the manufacture of the printed circuit board will create a compressive force on the protrusion, and cracks or fractures will form in the conductive material filled in the through-hole and lessen the precision and reliability of the through-hole itself.

SUMMARY OF THE INVENTION

An object of the present invention is to eliminate the above disadvantage of the conventional packing methods and to solve the above problems.

Another object of the present invention is to provide a method of packing conductive material, uniformly and without any protrusion of filler packed in through-holes in a printed circuit board, into the through-holes without being affected by the thickness of the printed circuit board, the number of through-holes, their diameter, or the like.

According to the present invention, there is provided a method of packing filler into through-holes in a printed circuit board, which comprises steps of packing the filler through a mask into the through-holes and at the same time smoothing protrusions of the filler at the upper and lower openings of the through-holes by means of squeegees.

In the above-described method, said mask may be a silk screen provided with open-worked packing holes for packing the filler in the positions corresponding to those in which the through-holes of said printed circuit board are packed.

In the above-described method, said filler may be packed by delivering pressurized filler from a packing nozzle, which comprises and a nozzle tip attached to the delivery end of the packing nozzle, the packing means being a packing means connected both to a manipulation means for actuating a delivery valve for delivering the filler from said nozzle tip and to a supply means for supplying the filler.

In the above-described method, said filler may be a solvent-less filler.

According to the above-described method of packing filler into through-holes in a printed circuit board, a uniform and stable packing of filler into through-holes is attained, without any protrusion of filler out of the upper and lower openings of the through-holes, without being affected by the thickness of the printed circuit board, the size of the through-hole diameter, or the fluidity of the filler.

These objects and other objects, features, aspects, and advantages of the present invention will become more apparent from the following detailed description of the present invention when taken in conjunction with the accompanying drawings.

DETAILED DESCRIPTION OF THE PREFERRED EMBODIMENTS

First Embodiment

Figure 1:
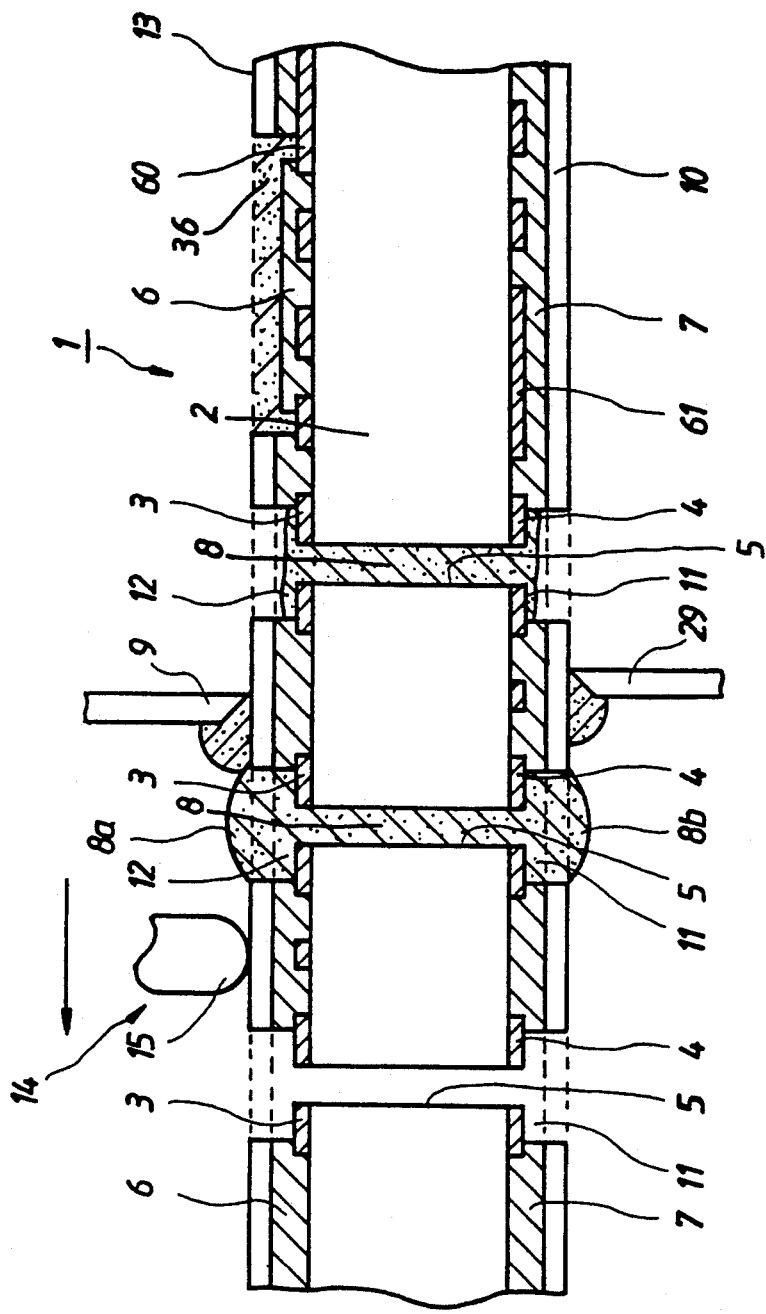
FIGS. 1, 2 and 3, are illustrations showing the sectional views of first and second embodiments of the present invention.

FIG. 1 is an illustration showing a sectional view of an apparatus according to; a first embodiment of the present invention.

Referring to FIG. 1, the reference numeral 1 indicates a printed circuit board having a construction such that circuit patterns 60 and 61 in the form of a conductor circuit are disposed on both sides of a substrate 2 made of an insulator, junction; lands 3 and 4 are arranged so as to electrically connect the circuit patterns 60 and 61 on the two sides of the substrate,; through-holes 5 are penetrated by punching or drilling between the two junction lands 3 and 4. The circuit patterns 60 and 61 on both sides of the substrate 2 are coated with under-resist (or solder resist) 6 and 7.

Each of the through-holes 5 on the printed circuit board 1 is packed with conductive material 8 after the printed circuit board 1 is mounted on the top side of a mask 10, which has been laid on a support frame (not shown). In this case, the mounting is performed by aligning an escape hole 11 of the mask 10 with the lower opening of the through-hole 5 on the printed circuit board 1 as shown in FIG. 1.

Furthermore, a mask 13 provided with packing through-holes 12 is mounted on the top side of the printed circuit board 1 in a manner such that the packing through-holes 12 will match the corresponding upper openings of through-holes 5 on the board 1.

Then, conductive material 8 is delivered from a nozzle end 15 of the horizontally-mobile packing nozzle 14 installed above the upper side of the mask 13. At the same time, the conductive material 8 is packed into the through-hole 5 on the printed circuit board 1 through the packing through-hole 12 of the mask 13.

Figure 2:
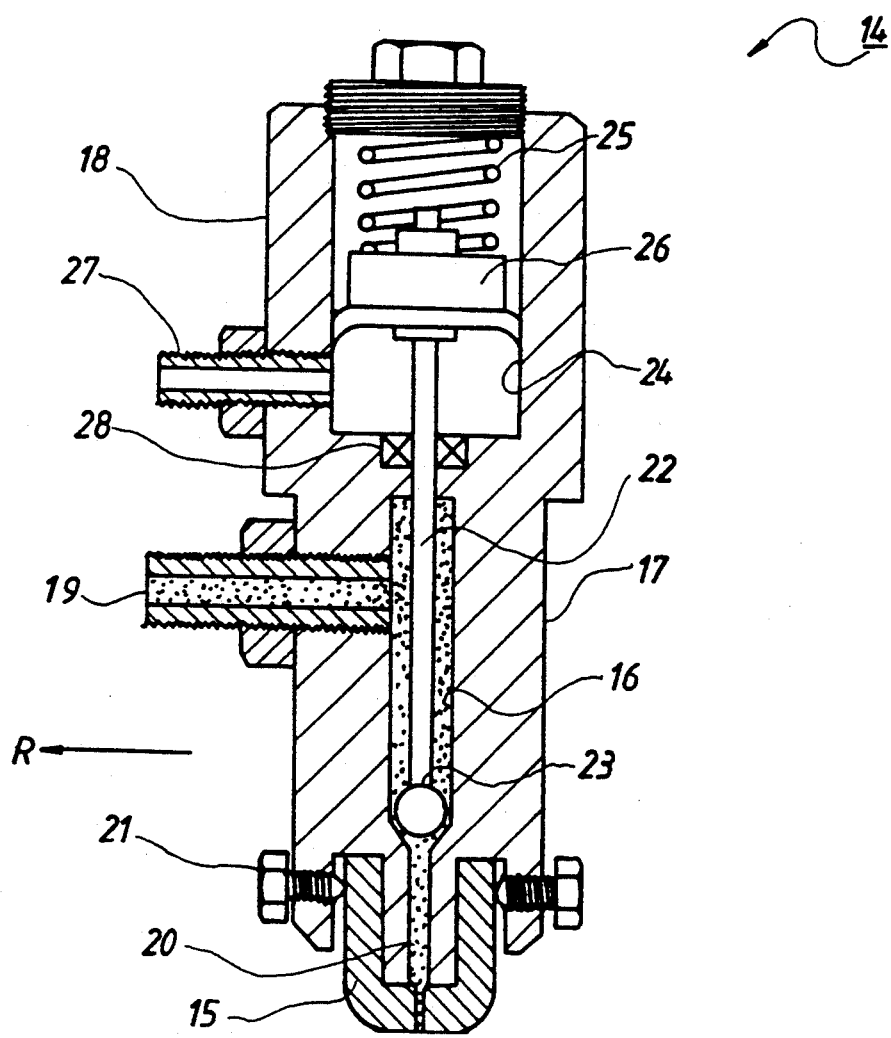

As shown in FIG. 2, the packing nozzle 14 comprises a main nozzle body 17, a packing means 16 for packing conductive material 8, and a manipulating means 18 for manipulating a delivery valve 23. The manipulating means 18 is mounted to the upper part of the packing means 16 within the main body 17.

The nozzle end 15 is attached with screws 21 to a delivery opening 20 of the packing means 16, to which conductive material 8 is supplied from a supplying means (not shown) via a supply hole 19.

The delivery opening 20 of the packing means 16 is mounted with the delivery valve 23 via a manipulation rod 22. The upper end of the manipulation rod 22 is connected to a manipulation valve 26, which is elastically provided by means of a spring 25 in a manipulation room 24 installed on the upper part of the main nozzle body 17.

A pneumatic manipulation source (not shown) is connected, via both a connecting port 27; and a controller (not shown) for controlling the pneumatic manipulation source, to the manipulation means 18 in the manipulation room 24. The reference numeral 28 is a slide bearing associated with the manipulation rod 22.

When the above-described packing nozzle 14 is used to pack conductive material 8 into the through-hole 5 via the mask 13, the nozzle end 15 is abutted against the top surface of the mask 13 via a manipulation means (not shown) for manipulating the packing nozzle 14 and then the packing nozzle 14 is slid in the horizontal direction.

During this horizontal shift, the nozzle scans the printed circuit board 1 to find the position that corresponds to the through-hole 5 and stops in order to raise the manipulation rod 22 of the manipulation means 18 against the resilient force of the spring 25 and to open the delivery opening 20 by actuating the delivery valve 23. Then conductive material 8 pressurized in the supply source is sent through the supply hole; 19 to the inside of the packing means 16, spouted from the nozzle end 15, and packed into the through-hole 5 via the packing hole 12 of the mask 13.

The masks 10 and 13 are formed using a silk screen (e.g., #180-300), but other masks can also be used if they satisfy the condition that no conductive material 8 flows to positions different from those that correspond to the through-hole 5.

Sample packing conditions governing the use of the packing nozzle 14 are listed below:

| | |
|---|---|
| Scanning speed of the packing nozzle | 10 mm/s |
| Thickness of the printed circuit board | 1.6 mm |
| Through-hole diameter | 0.4 mm |
| Injection pressure | 6.0 kg/cm$^2$ |

Viscosity of the conductivity material 1000 cps at 25° C. here copper paste with no solvent was used as the conductive material.

The conductive material 8 press-injected into the through-hole 5 via the packing hole 12 of the mask 13 from the packing nozzle 14 protrudes to the upper and lower openings of the through-hole 5, and this extra conductive material accumulates at location 8a and 8b. The excess materials 8a and 8b are removed by the upper and lower squeegees 9 and 29, which follow the horizontal movement of the packing nozzle 14 along the faces of the masks 10 and 13, thereby performing packing while smoothing the upper and lower ends of the through-hole 5.

After the conductive material 8 is packed under the above conditions, it is dried in an oven heater at 150° C. for 30 min to form a conductive circuit in the through-hole 5.

Second Embodiment

Figure 3:
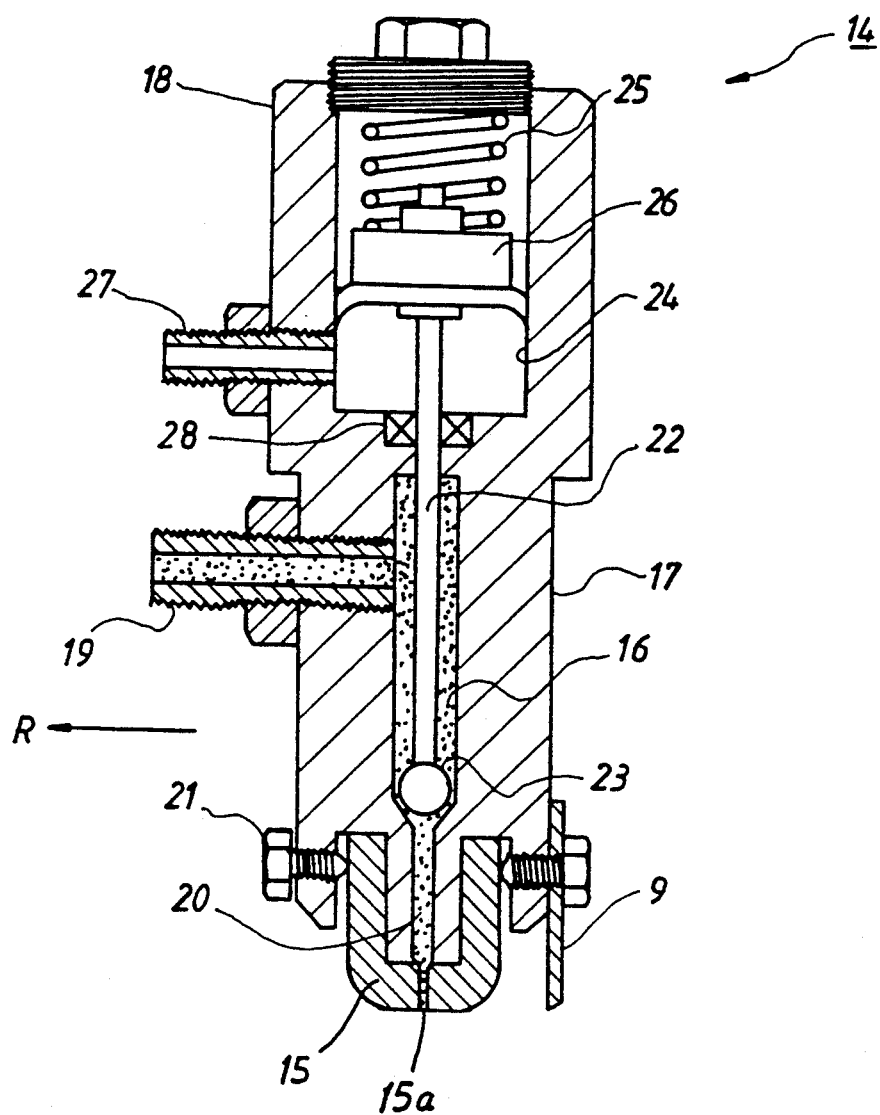

FIG. 3 is a cross-sectional view showing a method of packing filler into through-holes in a printed circuit board—according to—; a second embodiment of the present invention.

The second embodiment differs from the first embodiment only in the structure of the packing nozzle. Hence, the parts common to these embodiments in the respective figures are numbered in the same way, and no explanations will be given for these parts and their associated methods.

In the second embodiment, a squeegee 9 is mounted on one side of the nozzle end 15 in the packing nozzle 14 and behind the nozzle 14 in the horizontally-advancing direction of the nozzle 14.

The squeegee 9 fitted to the nozzle end 15 sweeps—; away the extra conductive material 8 stuck to the upper side of the through-hole 5 along the packing hole 12 during the course of horizontal movement of the packing nozzle 14 after conductive material 8 has been packed into the through-hole 5 with the packing nozzle 14.

The nozzle end 15 can be—adjusted—; to select the size of a delivery hole 15a by using fitting screws 21, but a plastic or synthetic rubber replacement is preferable to ensure maximizing the wear resistance of the surface abutting against the mask 13 and to protect the mask 13. The same applies to the materials for the squeegee 9.

The above description has been applied to an apparatus for packing filler comprised of conductive material. As for other types of filler, such as embedding filler, the above descriptions is also valid for all the embodiments.

In the first and second embodiments, conductive material 8 is packed into the through-holes 5 and the connecting hole 36 through packing holes 11 and 12 in the masks 10 and 13 by means of the packing nozzle 14 using compressed air pressure. For this reason, packing of small-diameter holes is made possible by adjusting the conditions of pressurized packing without being affected by the fluidity of the filler or the thickness of the substrates, thereby realizing high-density circuits.

Furthermore, the capability—of packing—without being affected by the fluidity of the filler eliminates the need to add a solvent to the conductive material, and thereby avoids the problems associated with adding a solvent. In other words, non-solvent packing can be accomplished by pressuring the packing nozzle.

The replaceability of the nozzle end 15 in the packing nozzle 14 allows uniform and stable pressurized packing to be performed in accordance with the delivery conditions of the filler, the diameter of the through-hole, or the board thickness.

Packing through a mask prevents filler from sticking to undesirable places, and continuous packing into those places that correspond to the circuit design of a printed circuit board enhances the packing performance.

What is claimed is:

1. A method of packing filler into through-holes in a printed circuit board, comprising: packing filler through a mask into through-holes in a printed circuit board such that the filler protrudes out upper and lower openings of the through-holes; and immediately thereafter smoothing the protrusions of the filler at the upper and lower openings of the through-holes by means of at least one squeegee.

2. A method of packing filler into through-holes as claimed in claim 1, wherein said mask is a silk screen provided with open-worked packing holes for packing the filler in the positions corresponding to those in which the through-holes of said printed circuit board are packed.

3. A method of packing filler into through-holes as claimed in claim 1, wherein said filler is packed by delivering pressurized filler through a delivery end of a packing nozzle, said packing nozzle comprising a packing means, a nozzle tip attached to the delivery end of said packing nozzle, and a delivery valve situated between the packing means and the nozzle tip for controlling the delivery of the filler from the packing means to the nozzle tip, said packing means being connected to a manipulation means for actuating the delivery valve for delivering the filler from said nozzle tip and to a supply means for supplying the filler from a supply source to the packing means.

4. A method of packing filler into through-holes as claimed in claim 1, wherein said filler is a solvent-less filler.

5. A method of packing filler material into through-holes of a printed circuit board, comprising the steps:
providing a printed circuit board having a pair of opposed surfaces and having through-holes extending therethrough from one opposed surface to the other;
providing a source of pressurized filler material;
injecting the pressurized filler material into the through-holes so that the filler material completely fills the through-holes and protrudes out opposites ends thereof; and
smoothing the protruding filler material which protrudes out opposite ends of the through-holes.

6. A method according to claim 5; wherein the smoothing step is carried out by moving a squeegee along the opposed surfaces of the printed circuit board to smoothen the protruding filler material.

7. A method according to claim 5; wherein the injecting step is carried out by displacing a nozzle relative to the printed circuit board to sequentially align the nozzle with respective through-holes, and injecting the pressurized filler material through the nozzle into the through-holes when the nozzle is aligned therewith.

8. A method according to claim 7; wherein the smoothing step is carried out by trailing a squeegee behind the nozzle with respect to the relative direction of displacement of the nozzle to smoothen the protruding filler material.

9. A method according to claim 3; including trailing a squeegee along both opposed surfaces of the printed circuit board.

10. A method according to claim 7; including adjustably setting the pressure of the pressurized filler material.

11. A method according to claim 7; wherein the step of providing a source of pressurized filler material comprises providing a source of solventless pressurized filler material.

12. A method according to claim 11; wherein the solventless filler material comprises electrically conductive material.

13. A method according to claim 5; wherein the step of providing a source of pressurized filler material comprises providing a source of solventless pressurized filler material.

* * * * *